United States Patent [19]
Zhang et al.

[11] Patent Number: 5,966,014
[45] Date of Patent: Oct. 12, 1999

[54] SYSTEM FOR SIMULTANEOUSLY TESTING A PLURALITY OF BATTERIES FOR MULTIPLE OPERATING SPECIFICATIONS

[76] Inventors: Chaojiong Zhang; Dennis Piwonka, both of 3206 Longmire Dr., College Station, Tex. 77845

[21] Appl. No.: 08/953,335

[22] Filed: Oct. 17, 1997

[51] Int. Cl.⁶ .......................... G01N 27/42; G01R 31/36
[52] U.S. Cl. .......................... 324/434; 324/426; 324/437
[58] Field of Search ............................ 324/426, 427, 324/433, 434, 437, 754; 340/636; 361/728

[56] References Cited

U.S. PATENT DOCUMENTS

| | | | |
|---|---|---|---|
| 4,204,161 | 5/1980 | Strickland | 324/426 |
| 4,360,780 | 11/1982 | Skutch, Jr. | 324/437 |
| 4,377,786 | 3/1983 | Paul et al. | 324/426 |
| 4,841,241 | 6/1989 | Hilz et al. | 324/754 |

FOREIGN PATENT DOCUMENTS

| | | | |
|---|---|---|---|
| 9099271 | 7/1984 | Japan | G01R 31/36 |
| 7226234 | 8/1995 | Japan | H01M 10/44 |
| 7097004 | 11/1995 | Japan | B65G 1/00 |

*Primary Examiner*—Diep N. Do
*Attorney, Agent, or Firm*—Gunn & Associates, P.C.

[57] ABSTRACT

This disclosure sets out a multiple battery tester having a tray loaded with a set of batteries. The tray is placed in a receptacle and end located terminals move vertically to clamp a battery. The contacts bear on the battery, establishing a current flow path. This loop connects in charge/discharge system for testing. Test routines can be varied and data is recorded over time.

62 Claims, 8 Drawing Sheets

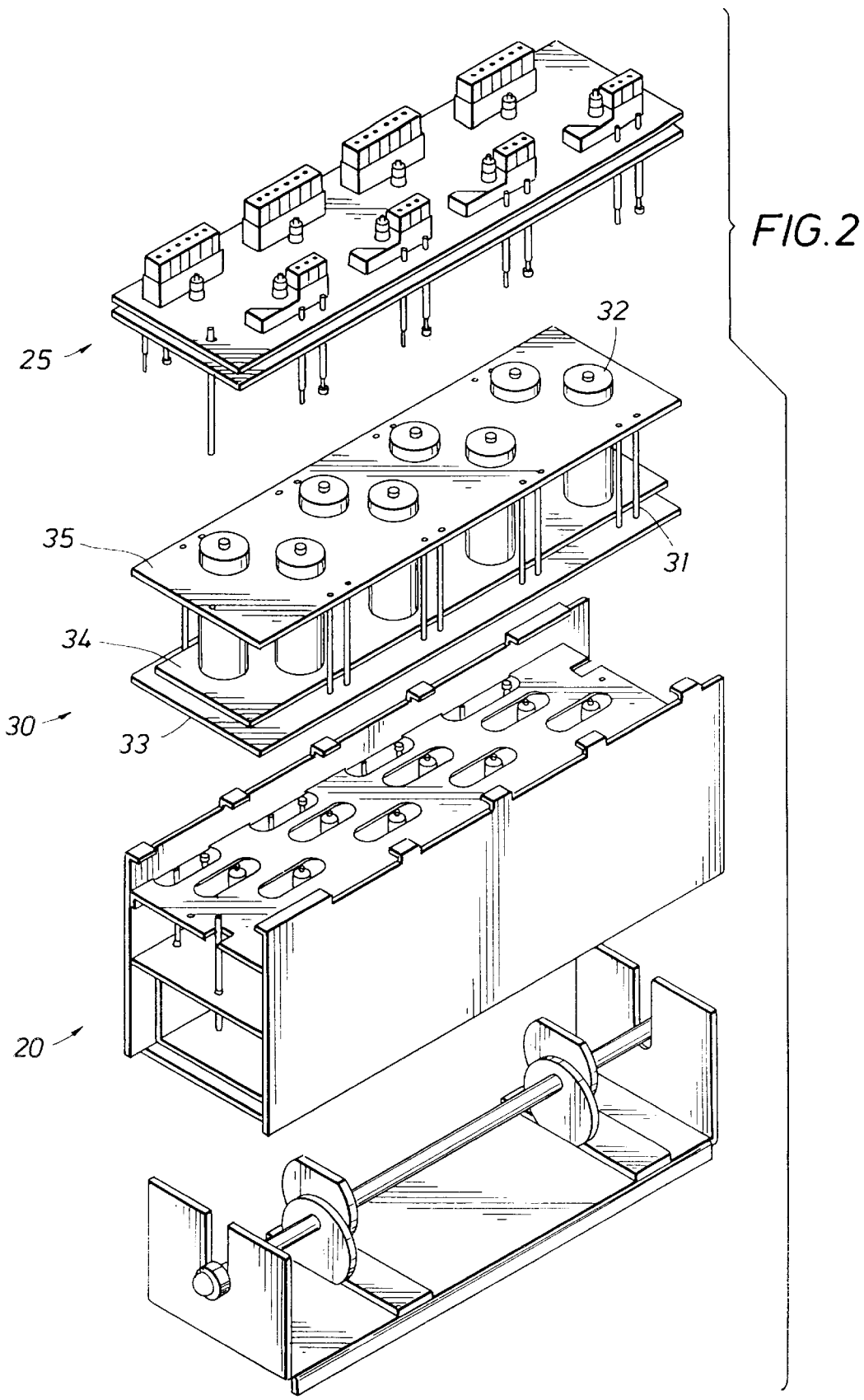

SYSTEM FOR SIMULTANEOUSLY TESTING A PLURALITY OF BATTERIES FOR MULTIPLE OPERATING SPECIFICATIONS

FIELD OF THE PRESENT DISCLOSURE

This disclosure is directed to a battery testing system, and more particularly to a battery testing system which is constructed and arranged to test a large number of similar battery cells in a test of many cells simultaneously. It is intended to be used with a large manufacturing facility to provide either testing of samples or testing of the entire production thereof.

BACKGROUND OF THE DISCLOSURE

This disclosure is directed to a battery testing system. It is a testing system which is intended to be used with batteries of all types, sizes and shapes. Examples of batteries that can be tested are the high volume, low cost batteries having a nominal cell voltage of 1.5 volt DC and which are provided in cylindrical shells conforming with industry standards for batteries such as AA, AAA, B, C and D. While there are many other sizes, these are typical of the elongate cylindrical battery which has a positive terminal at the upper end and a negative terminal at the lower end. That is a first or representative size. In addition to that, there are circular batteries shaped more as a button. The positive terminal is at the upper end and the negative terminal is at the side of the button. While cylindrical, the diameter is usually two or three times greater than the thickness. Testing of cylindrical and button cells will be the primary examples, but that is not intended to exclude testing of rectangular batteries which have two terminals on the top end. These contrast with the AA cells or the button type cells (type PX625 cells) in that they may readily include two or more cells in a single housing which are connected so that they provide a desired terminal voltage which is higher than 1.5 volts. For instance, a 12 volt cell is comprised of eight serially connected individual cells which are assembled in a single structure in a single housing having one pair of terminals. Such multi-cell batteries providing higher voltage than 1.5 volts will be denoted hereafter as HVB (meaning multi-cell or high voltage batteries). It is assumed that the A, B, C and D cells can be exemplified by a particular dimension such as the AA cell, and that will be denoted hereinafter as the AAB meaning a single voltage cell of cylindrical construction conforming with the AA standard. Button shaped batteries will be known hereinafter as BB representing button batteries.

Other types of batteries can also be tested and that includes NiCd batteries, lithium type batteries, and others which happen to be rechargeable. Accordingly, the test equipment and several of the test procedures set forth below apply to batteries which are capable of multiple charges, i.e., they can be recharged. It also applies to those which cannot, namely, chemical cells which undergo an irreversible chemical conversion and are no longer chargeable.

It is not uncommon to manufacture several thousand AAB per hour. Indeed, they typically must be manufactured in large volume to be able to profitably make such batteries. Further, it is not uncommon to make a large number of batteries which pass all requirements for the particular quality control standards applied to a particular battery. Occasionally, something will go wrong with the manufacturing process. For instance, the chemicals which make up the AAB may be off standard. The assembly may be erratic and sub standard batteries are then made thereby. It is not uncommon for this to happen thereby causing the manufacture of a large number of defective batteries. When that occurs, the defective batteries need to be screened and not shipped. While the manufacturer can tolerate shipment of an occasional battery which is defective, either in terminal voltage or life, it is highly desirable that the manufacturing process be controlled with sufficient quality control (QC) that specified high QC standards are met. This involves substantial testing. Whether random individual units are tested or the entire production run, routine QC testing is helpful. In one aspect of the present disclosure, testing is enabled for all levels of QC including random or sampled selection at one extreme to testing of the entire production run at the other extreme. The present apparatus is a system which enables such testing. It will be described in the context of making perhaps 100,000 or more AAB during a production run.

SUMMARY OF THE INVENTION

The present disclosure sets forth a highly effective tray which holds a number of the AAB aligned for testing. Each AAB is inserted into a tray and is held in the tray. They are aligned so that the positive terminal at the upper end and the negative or ground terminal at the lower end are appropriately registered with respect to the test equipment, and testing is thereafter initiated.

The present disclosure sets forth a mechanism which loads a number of batteries into trays and positions them between appropriate probes or contact assemblies. Consider a typical AAB; it is necessary to make firm contact at a consistent location typically on the centerline axis. The centerline axis is best to assure that there is no variation from battery to battery resultant from the point of contact by the probe assembly. Just as importantly, high quality contact must be obtained at both ends of the AAB. More than that, it is necessary to have a sure and certain contact of the probe assembly for the electric current which is required to be drawn from the battery for test purposes. Another probe assembly, preferably concentrically arranged, is involved in testing the cell voltage. The voltage contact does not require an equal current handling capability. The present structure sets forth a system which operates both the current and voltage probes. They are properly aligned so that they contact jointly and provide both signals, i.e., a current signal and a voltage signal. While the foregoing is true of the one probe, the opposite end of the AAB must contact a current return probe. These are at opposite ends of the AAB, and must be aligned so that they move vertically along a common line of travel. This common line of travel is accomplished mechanically by the equipment to be described and yet is done without the entanglement of a number of cords, wires or harnesses. Assume for instance that two batteries are loaded in a tray and are tested simultaneously. Ordinarily, this would require two wire loops, one for each battery, so that a current flow pathway can be defined through the individual battery loops extending from top to bottom of the AAB. If the tray, however is loaded with 100 batteries, this would require 100 loops. The present disclosure avoids that requirement, i.e., it defines a system which does not need 100 loops or, indeed, does not require any wire loops. Rather, current transfer is through a different route altogether to thereby avoid wire loops.

One deleterious aspect of battery testing is that batteries occasionally fail by rupture of the case, flowing either liquid or tacky chemicals downwardly, and otherwise risking damage to the equipment located there below. The present system utilizes a tray which mounts the batteries for contact from below. The contact mechanism, however, does not include a printed circuit board (PCB). The equipment below the battery can withstand a good deal of abuse. The abuse does not pose any great risk because leaking or exploding batteries will not detrimentally damage the equipment nor will it deter its safe operation. Spillage of corrosive chemicals from the system can be readily tolerated. In one aspect of the present invention, the system incorporates a tray mounting mechanism which traverses the machinery and moves the tray of batteries upwardly and downwardly into contact. This mounting system operates between batteries serves as a carrier for a large number of batteries undergoing tests. The tray is mounted so that the machine can be opened, the tray inserted readily and easily, and then all the batteries on the tray are tested. They are tested as a unit or group. This means that simultaneous testing of some number of batteries, preferably a large number, can be obtained quickly. In that regard, each tray, therefore, preferably holds a relatively large number of batteries, a typical example for an AAB being a tray of perhaps two or four batteries in width and any length that might be desired. It is not uncommon to test as many as forty batteries at one time although the number can be varied upwardly or downwardly depending on the size of the tray which, in turn, is at least partly dependent on the size of the battery being tested. For an AAB, it is possible to load a relatively large number on a single tray.

The present disclosure additionally sets forth a monitoring scheme which observes battery temperature during testing. It is possible for a battery to provide successful performance, as measured, but the performance is more readily known and understood by measuring the temperature with the temperature probe applied to either one battery or to each of the several batteries. This obtains measurements which are useful in determining QC performance, and it may also be useful in preventing damage in the event that a battery overheats rapidly. well nigh approaching the explosive condition.

BRIEF DESCRIPTION OF THE DRAWINGS

So that the manner in which the above recited features advantages and objects of the present invention are attained and can be understood in detail, a more particular description of the invention briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIG. 2 is a view of the battery transport mechanism shown in FIG. 1 further incorporating a battery tray for holding a plurality of batteries for testing;

DESCRIPTION OF THE PREFERRED EMBODIMENT

While the foregoing summarizes one preferred embodiment of the present invention, other and further embodiments of the invention may be devised without departing from the basic scope thereof, the present invention is exemplified below. In describing the apparatus of the present disclosure, the description will initially start on a battery tray which is intended for testing a large number of batteries simultaneously. It will be described so that the tray is loaded with a number of similar cells. A common cell such as the AAB will be used for illustrative purposes. The primary description will start with the mechanical aspects. Thereafter, the current flow paths through the AAB test cells will be given. Thereafter, other aspects of battery testing will be set forth. Since all the testing involves the proper indexing of individual cells, the cells must be initially loaded and moved into the test equipment, the test equipment will be given first and electrical testing protocols will be set forth later.

BATTERY TRAY AND TRANSPORT MECHANISM

Figure 1:
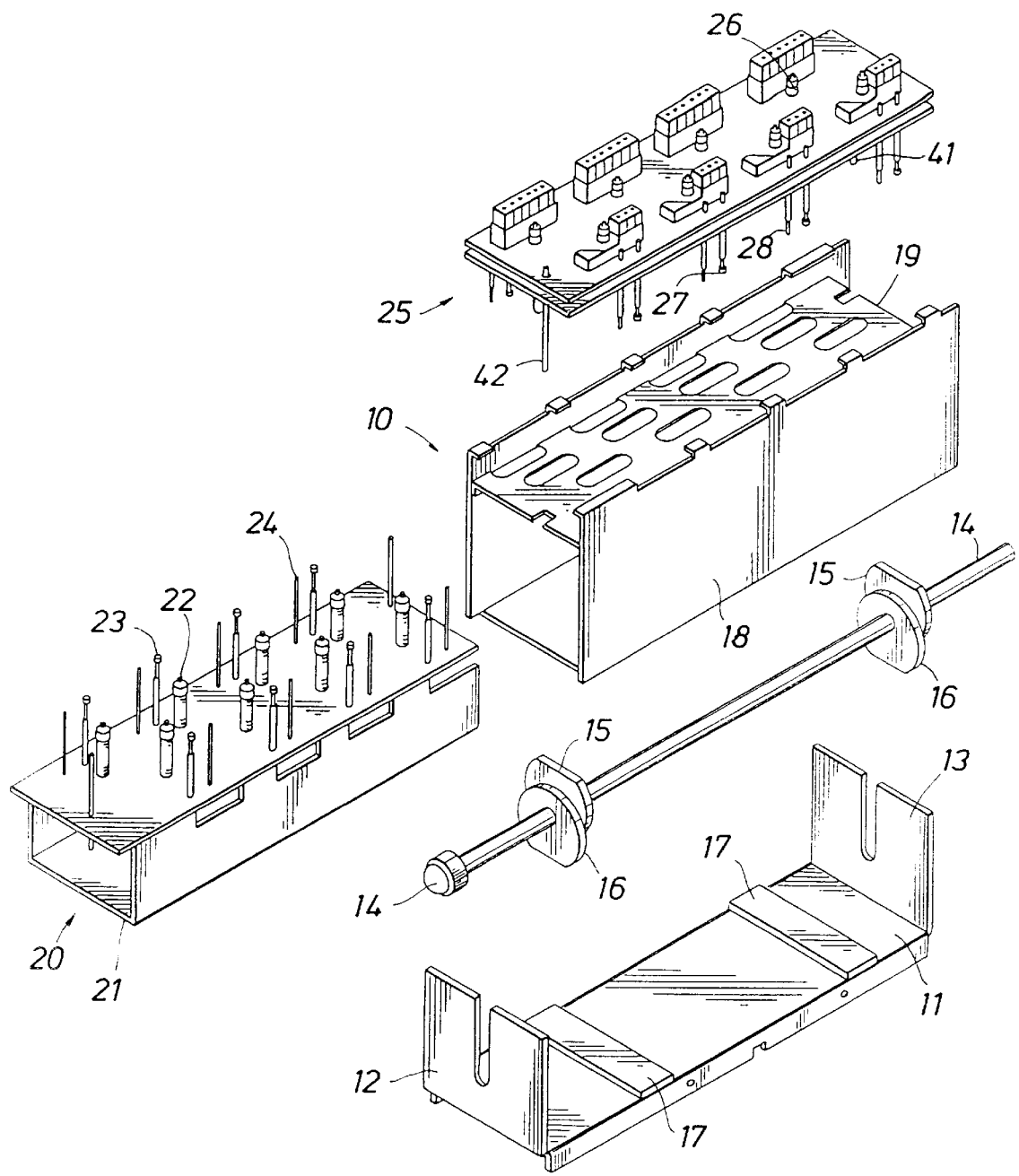
FIG. 1 is an exploded view of a battery tray transport mechanism for testing a large number of batteries simultaneously.

Attention is jointly directed to FIGS. 1, 2 3A and 3B which will be considered together. They set forth the transport mechanism in general and the battery tray which is loaded into it for testing of a set of cells. This is best understood by referring first to FIG. 1 of the drawings. This exploded view shows a vertical motion transport mechanism which moves individual batteries upwardly. It is best understood proceeding from the bottom of FIG. 1. Accordingly, FIG. 1 shows the battery transport mechanism 10 for loading a battery tray and moving the tray into a specific position. In the lower portions, there is a mounting bracket 11 which is fixedly anchored in a cabinet. It has front and rear upstanding tabs 12 and 13 which are aligned in parallel positions above the mounting frame member 11 to receive and support a cam shaft 14. The cam shaft supports at least a pair of spaced cams, there being two similar cams 15 rotated into one position and two different cams 16 which are rotated to a different angle. The cams 15 and 16 have flats on them which are located 180° out of phase. The cam shaft 14 is positioned in the matching notches in the alignment tabs 12 and 13 where the shaft is supported for rotation. The cams are mounted at an centered point so that the cam shaft 14 is raised as a result of rotation during operation. This will become more clear on review of FIGS. 3A and 3B of the drawings. The cams are located so that they lift by contact against the frame 11 with contact against the contact plates 17 mounted on the frame 11. The upward movement will be correlated to the other components shown above the cam system in FIG. 1 of the drawings.

FIG. 1 shows, at a central location, a hollow elongate lower contact box 18. It is hollow to receive a rectangular member which is inserted into it and which aligns with selected holes in the top plate 19. The bottom contact assembly 20 is shown in the exploded relationship and is inserted into the hollow box 18. The bottom contact assembly 20 is constructed with a bottom plate 21 which is aligned above and, therefore, raised by the cams 15 and 16 just mentioned. The bottom plate 21 serves as a cam follower to raise and lower the lower contact assembly. The lower contact assembly 20 is guided so that a number of upstanding components on the top of it are properly aligned for movement into operative contact with a set of batteries. The contacts include, specifically, contacts 22 which bear against the AAB to be tested, and current flow contacts 23 arranged along the edge. There are also voltage contacts 24 arranged along the edge. The system is constructed so that there are separate current flow paths for each particular AAB undergoing tests, and also there are separate voltage contacts for each. The current flow path is structurally heavy duty in comparison to the gauge or weight of metal in the voltage contacts. The current flowing in the voltage contacts 24 is relatively small but it is sufficient to provide an adequate voltage signal. The current flow rates differ by several orders of magnitude. It is not uncommon for the current in the voltage contacts to be in the microampere range. The contacts 23 and 24 are located marginally along the edges for alignment with and connection to cooperating components to be explained.

Recalling that the lower contact assembly 20 is inserted into and aligned under the plate 19, the upper contact assembly 25 is placed above it. The upper contact assembly has the preferred form of a number of centerline contacts 26 which connect at the centerline axis of each of the test cells. They are deployed so that they align with the AAB cells undergoing tests. Each particular cell is thus contacted at the centerline both from the top and bottom. The top or upper contact assembly 25 is constructed with a set of marginally located contacts 27 and 28. Again, the contacts 27 and 28 differ in size or scale just as the contacts 23 and 24 for the lower contact assembly.

As described to this juncture, important details have not yet been given with regard to the contacts marginally located along the sides of both the lower and upper contact assemblies. Also, the contacts actually bearing against the test cells have not been detailed. Details will be given below. The significance of the placement, however, should be more readily understood on viewing FIG. 2 of the drawings which is the same exploded view as shown in FIG. 1 except that the battery tray 30 has now been illustrated and it is located in a sandwiched relationship by the contact assemblies which are above and below. Going to that part of FIG. 2 the battery tray 30 locates a number of AAB cells 32 which are clamped in the structure, thereby resting on a bottom plate 33 having the lower end captured in an alignment plate 34 and they extend upwardly through the top plate 35. The plates 33 and 34 are parallel and have different size openings in them to thereby enable the individual cells 32 to rest on the plate 33. The cells cannot lean or cant to the right or left because they are captured in the plate 34. The two plates provide a recessed area where each cell is supported and is not free to move left or right. The several plates are held together by a set of alignment posts 31 which extend vertically between the plates to define a rigid structure, namely, the battery tray 30. The battery tray is complete as illustrated to define a passive device which merely holds or racks a number of AAB cells loaded prior to testing. As illustrated, eight are shown in FIG. 2 but it will be understood that this number can be markedly increased. This depends on the size of the individual cells, the length of the battery tray 30 and other scale dimensions which can be varied by one of average skill in the art. Just as the number of cells is varied, and that number is a whole number positive integer N, the contacts in the lower contact assembly and the upper contact assembly must match. The lower contact assembly 20 as well as the upper contact assembly 25 are replicated according to the same scale factors.

Figure 3A:
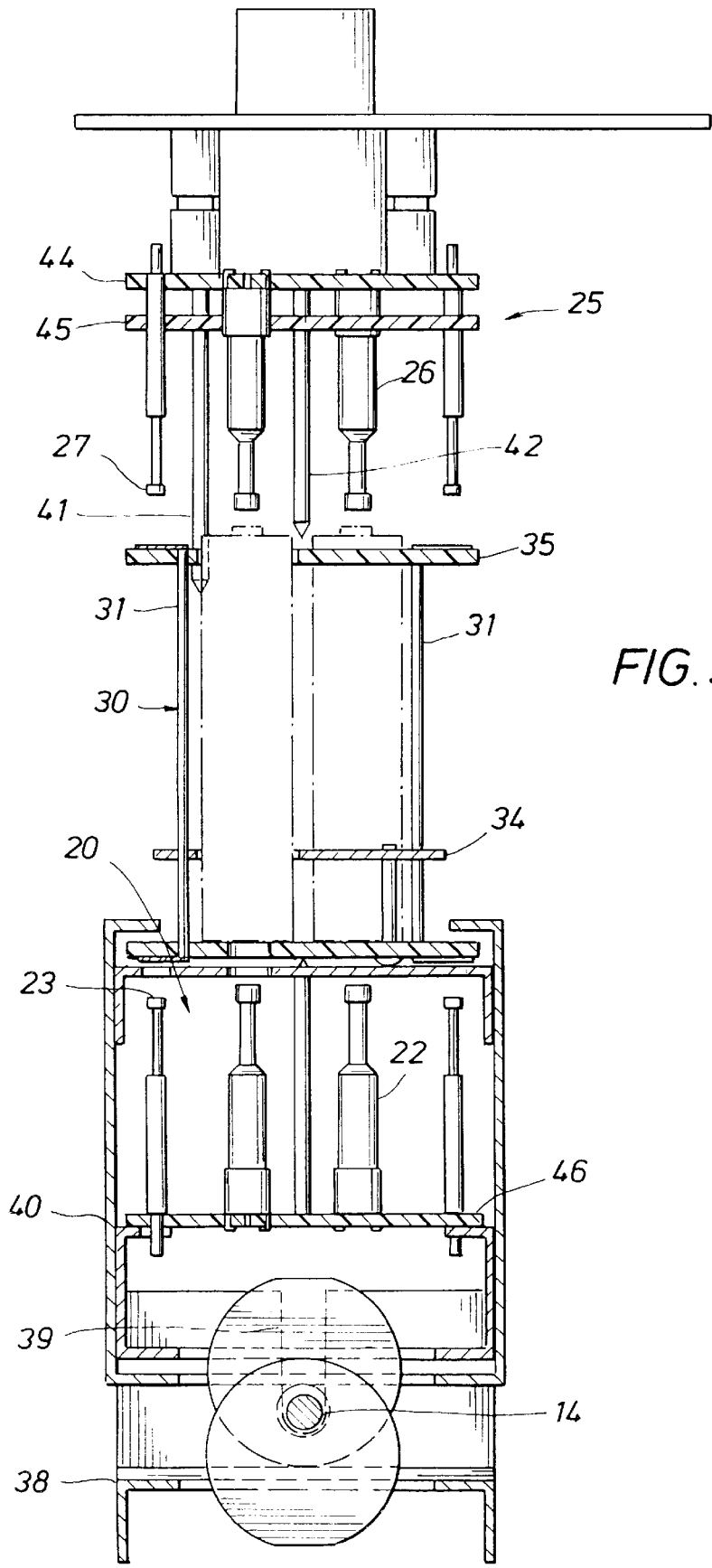
FIG. 3A is an end view showing cam operation wherein the tray has been appropriately aligned and loaded but prior to movement and further showing the position of a set of contacts above and below the batteries.
Figure 7:
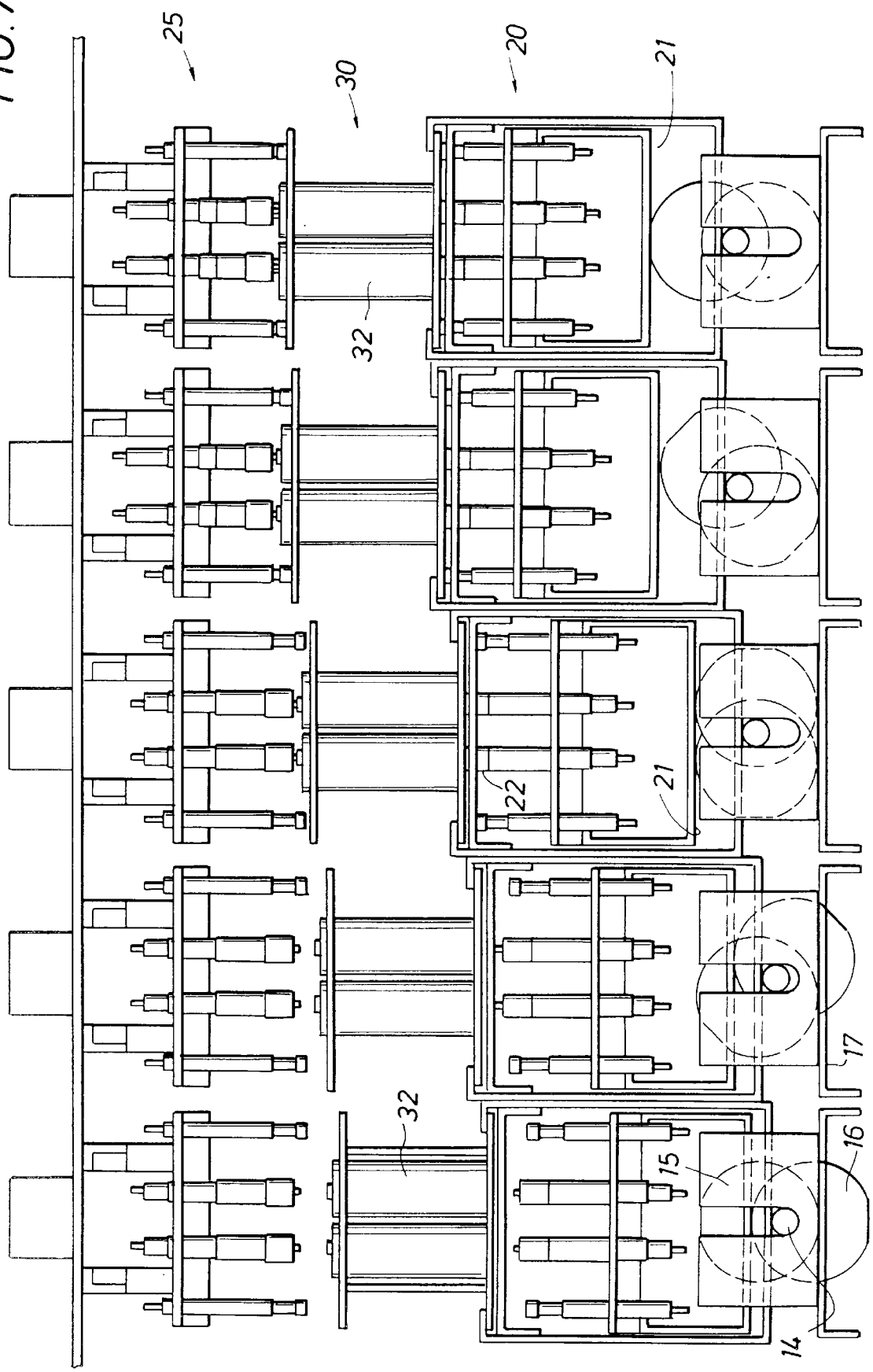
FIG. 7 shows progressive movement to lock the tray to assure contact closure.

Summarizing what has been said to this point, FIGS. 1 and 2 show how N of the AAB can be aligned and held as a unit or group for testing. The battery tray 30 is loaded remote from the equipment, and is then inserted and captured between the lower and upper contact assemblies 20 and 25. The cam is then rotated by rotating the shaft 14 to raise the battery tray as will be understood on viewing FIGS. 3A and 3B of the drawings. FIG. 3A shows the cam 14 supported in a cabinet or housing member 38 which is provided with an alignment slot 39 for capturing the cam. This supports the external frame 40 extending upwardly and aligning the battery tray 30 so that it can be inserted and moved. This moves as a unit with upward translation as shown progressively in FIG. 7 of the drawings. FIG. 7 shows five different positional locations of the battery tray 30 that result from rotation of the cam. From the left, the cam is shown rotated at 0°, 45°, 90°, 135° and 180°. The tray 30 is raised progressively. As it is moved upwardly, the individual batteries 32 are then moved into operative position. It will be observed that the upper contact assembly 25 bears against the individual batteries 32 at the respective locations aligned with the battery cells. The AAB 32 are thus moved to a location for convenient testing. The N cells move together for testing. As shown in FIG. 3A, the battery tray 30 moves into operating proximity of one alignment pin 41 and then a second pin 42 which jointly register the battery tray 30 properly with the upper contact assembly 25. As further shown in the progression of the five views of FIG. 7, two sets of contacts are brought to bear against each of the batteries. The contacts along the outer edges of the upper and lower contact assemblies are also involved. They will, however, be discussed separately in conjunction with a description of the mode of operation shown in FIGS. 3A and 3B.

BATTERY CONTACT MECHANISMS

Figure 3B:
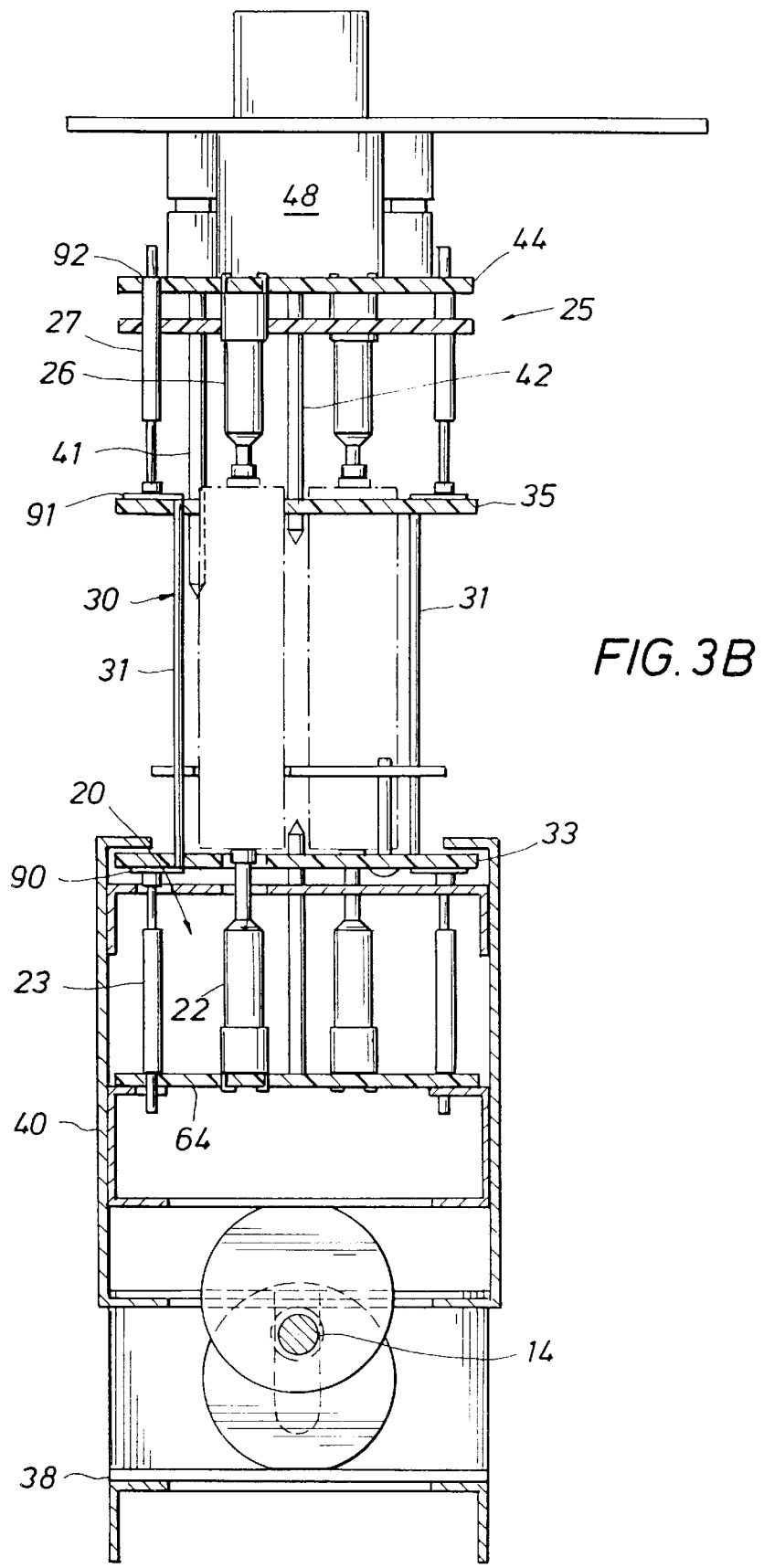
FIG. 3B is a view similar to FIG. 3A showing the position of the contacts within the tray and batteries in the tray so that complete circuits are completed.

Attention is now directed jointly to FIGS. 3A and 3B. The battery tray is located between the two contact assemblies 20 and 25. In FIG. 3A, no contact has been made. Construction of the tray to obtain contact alignment should especially be noted. The top contact assembly 25 incorporates an upper printed circuit board (PCB hereinafter). The PCB 44 is parallel to the PCB 45, and they assist in maintaining parallel alignment in the various components. There are edge located contacts and one is exemplified at 27. As a generalization, the edge located contacts 27 and 28 are similar in construction and differ primarily in the size of the contacts at the tip. Where greater current is required, they are larger in diameter. They operate in the same fashion. The tray 30 is constructed with the upstanding post 31 which extends from top to bottom of the tray. The post 30 is incorporated for structural rigidity of the tray but it also provides the added function of being a current conductor. This is isolated electrically by means of the insulation which makes up the PCB which comprises framing members of the tray 30. The tray is rectangular and rigid and is therefore easily aligned when inserted into the test equipment. As previously noted, the tray is comprised of the parallel structural PCB members 33, 34 and 35 which are held in the properly aligned relationship by the upstanding posts 31.

Going now to FIG. 3A and in particular the contact assembly 20 which is located below the tray 30, this particular contact assembly is equipped with similar contacts as the upper contact assembly. An example is shown at 23 where a current contact assembly along the marginal edge of the tray is illustrated. More will be noted regarding that contact assembly and its operation.

SEPARATE VOLTAGE AND CURRENT FLOW PATHS

Separate current flow paths are provided for voltage and current measurements. Separate paths have an advantage which should be noted. Briefly, the current flow during a test may be several amperes while the current flow in the voltage measurements will be in the microampere range. Easily, the difference can be many orders of magnitude. This creates a problem with regard to obtaining a reference point for the measurements. For that reason, the contact assemblies 22 and 26 are shown in FIGS. 1, 2, 3A and 3B. Going now to FIG. 4A, added detail is illustrated to set forth important aspects of the battery contact assemblies and in particular the dual contact mechanism.

Figure 4B:
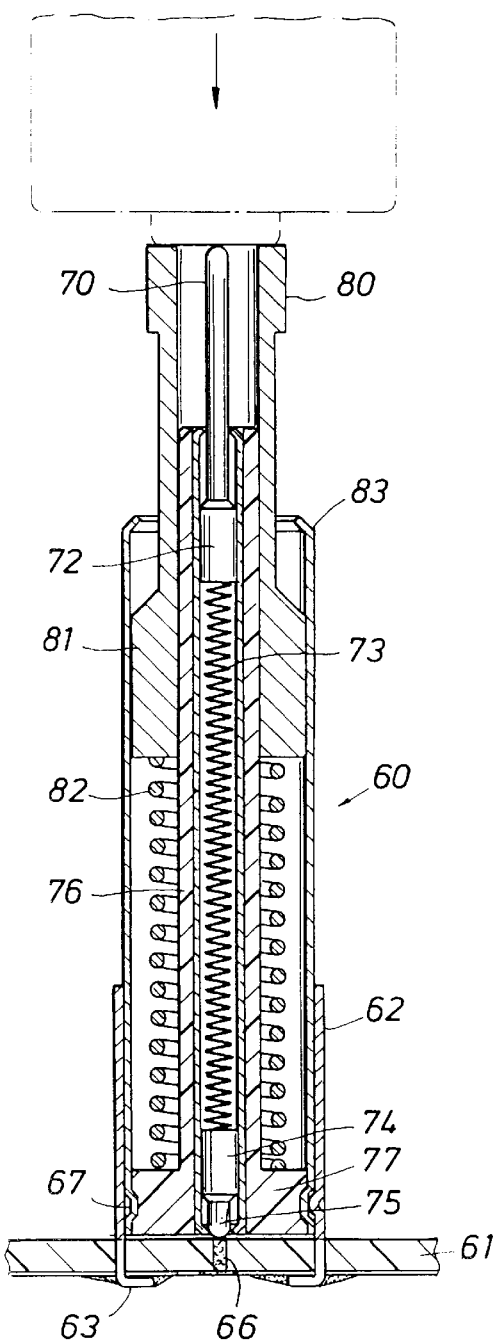
FIG. 4B is a view similar to FIG. 4A showing contact of a battery against the probe assembly in FIG. 4A wherein two separate contact paths are made.
Figure 4A:
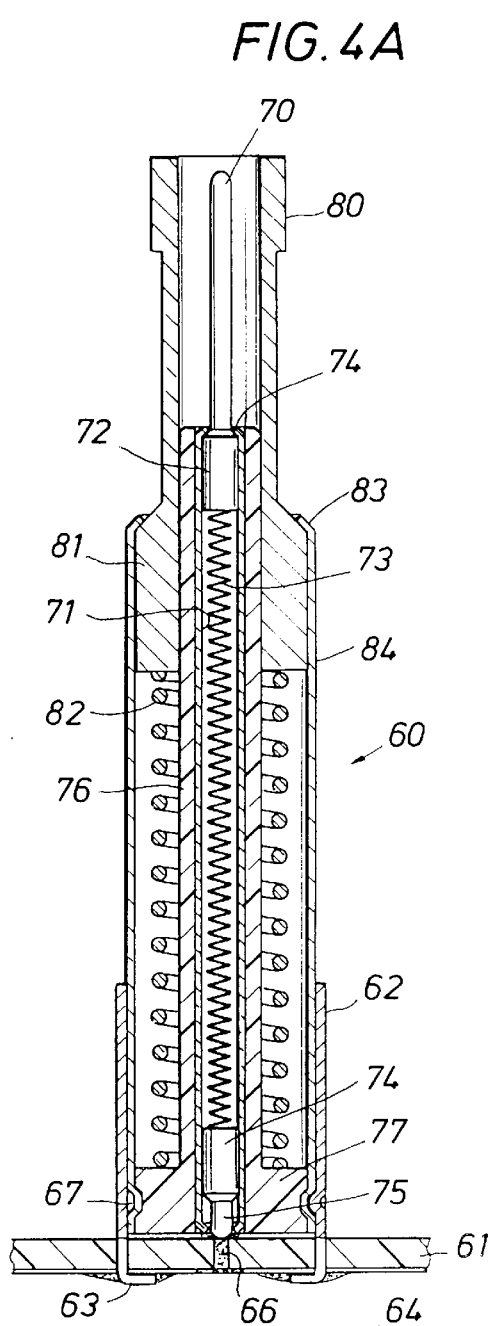
FIG. 4A shows a pair of concentric probes in an extended position which are mounted in a socket on a printed circuit board.
Figure 5:
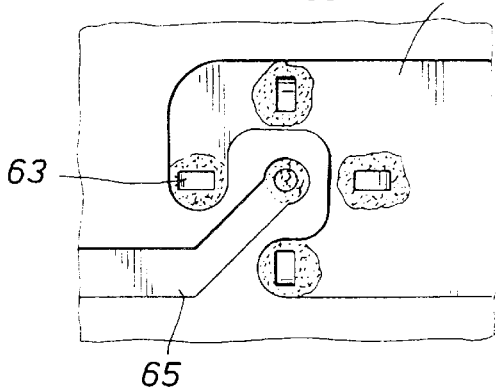
FIG. 5 shows the electrodes connected to the probe assembly of FIG. 4A which are extended through the printed circuit board and illustrates the conductive paths on the printed circuit board.

In FIG. 4A, a contact assembly 60 is shown. It is mounted on a PCB 61. The mount is obtained from a socket 62 which has several metal stakes 63 which extend through the holes in the PCB and which are folded on the opposite side to lock the socket in place. The several stakes 63 extend through a conductor pad 64 which is large in size to define a current flow path. It is especially intended for large current levels in comparison with a smaller current conductor path 65. That conductor path is located on the centerline location and connects through a hole 66 to make connection with the center contact as will be described. The socket provides a detent 67 for snapping in place. The socket holds the dual probe assembly in the socket by snapping at the detent.

Considering the socket in FIG. 4A from the centerline, there is an inner probe 70 which is formed of conducting metal. It is received inside a metal sleeve 71 and the sleeve 71 provides electrical continuity. The probe 70 terminates at an enlargement 72 which telescopes inside the sleeve 71 and is forced upwardly by a compressed coil spring 73. It moves upwardly until it locks against the shoulder 74 which limits travel. The conductive sleeve 71 is conductively in contact with a plug 74 at the lower end and a conductive point 75 which connects with the conductor 66 through the hole formed in the PCB 61. This serves as a voltage signal path. The current which is conducted through this signal path is small, typically in the range of just a few microamperes. Moreover, it is insulated from the outer current flow path by a non conductive sleeve 76 which is supported on an integral insulative base 77. The base provides alignment for the insulative sleeve 76.

While the foregoing describes one conductor pathway, another pathway comprises the contact 80 at the outer end. It is much larger and has a very large footprint. It is sized so that it will conduct a large current flow. The contact 80 is built in an integral construction with an enlargement 81 which is concentric about the equipment for the voltage contact. The enlargement 81 has a downwardly facing shoulder which abuts against a coil spring 82. This spring forces the enlargement 81 upwardly against the shoulder 83 which limits travel. The coil spring 82 is supported on the insulative base 77. Current flow is transferred from the contact tip area 80 through the enlargement 81 into a surrounding sleeve 84. The sleeve 84 snaps to the socket 62 and current flows through the socket and to the opposite side of the PCB 61. In theory, both probes 70 and 80 are contacted against the same battery at the same terminal. They, however, have entirely different functions. A voltage signal is provided by one while the current flow is transferred out of the system by the other. The current flow in the two may differ by several orders of magnitude. They connect to different circuit components through the PCB pads 64 and 65 which are electrically insulated from each other.

FIGS. 4A and 4B together show how contact is made by the contacts 70 and 80. Moreover, this contact can involve either end of the battery. As shown in dotted line, it can be contact with the centerline button which is the positive terminal on a typical flashlight cell. Likewise, however, it can be contacted against the bottom of the battery which is typically the negative terminal. It works in both instances.

Going now from the contact assembly to the deployment of the contacts shown in FIG. 3B, the following significant aspects need to be noted. Consider the fact that in FIG. 3B, the lowermost centerline probe 22 is constructed in accordance with FIG. 4A and therefore provides a large current flow through the conductor pad 64 on the hack side of the PCB. That current is directed to the marginal edge where it is then delivered upwardly through the compressible probe 23 on the left side of FIG. 3B. Current flows through the compressible contact at the tip of it. That current is directed into the conductive pad 90 on the bottom side of the PCB 33. That current is then directed through the upstanding post 31 to the pad 91 on the top face of the PCB 35. In turn, that makes contact with the contact assembly 27 which completes a circuit along the left hand side of FIG. 3B. The contact assembly 27 in turn connects with a plated conductor 92 on the top of the PCB 44. In turn, that is directed to the relay assembly 48 incorporated on the PCB 44 to switch current and voltage connections as will be explained. Optionally and under control of the relay 48, current is also able to flow downwardly through the centerline contact assembly 26 which is incorporated for contact with the centerline axis of the battery.

Considering what has been stated about FIG. 3B to this point, there is an optional short circuit completely around the battery which is comprised of the upstanding post 31 parallel to the battery and which makes connection through the various contact assemblies. From the positive battery terminal, the current flow path is through the current contact assembly 26, across the PCB 44, through the contact assembly 27, to the conductive pad 91, then the post 31, then the pad 90, then the contact assembly 23, along the pad 64 and into the centerline probe assembly 22. Some testing will require the imposition of a short across the battery. Even when that does occur, the voltage probe 70 shown in FIG. 4A is able to make contact at both terminals of the battery so that voltage measurements are obtained. The voltage signal measurements are routed through similar contacts and posts 31 but they are directed along different routes. To this end, a single battery is aligned with centerline contact assemblies 22 and 26 below and above the battery. These, however, provide two signals, one being the current flow and the other being the voltage signal. Two paths are therefore arranged parallel to the battery. One path is the current flow path and the other is the voltage signal path. Both paths connect optionally through the relay 48 which is operated to change the connections of the current flow path and the voltage flow path. These two connections are altogether different depending on the operation of the relay 48. One important aspect of this construction is that it is completely devoid of wired connections. Without wiring, all connections are made through the PCB connections on the various PCB layers. As viewed in FIGS. 3A and 3B, there are simply no wires to connect. This is an important aspect of the system. It is important because a wiring harness at this location is suspect. The range of travel of the contact assemblies is fairly large. Moreover, such wiring will fail because of repetitive opening and closing which creates fatigue in the wiring. In another aspect, the wiring may fail because the wiring is exposed to unwanted chemical damage as a result of failure from time to time. When a batter)y does fail, the chemicals within the shell will leak or bleed onto the wiring.

More importantly, not only is the system devoid of wiring, but it provides two separate signal paths. One is devoted to the current flow and the other is directed to the voltage signals.

RELAY ACTUATED TEST CONTROL

Figure 6:
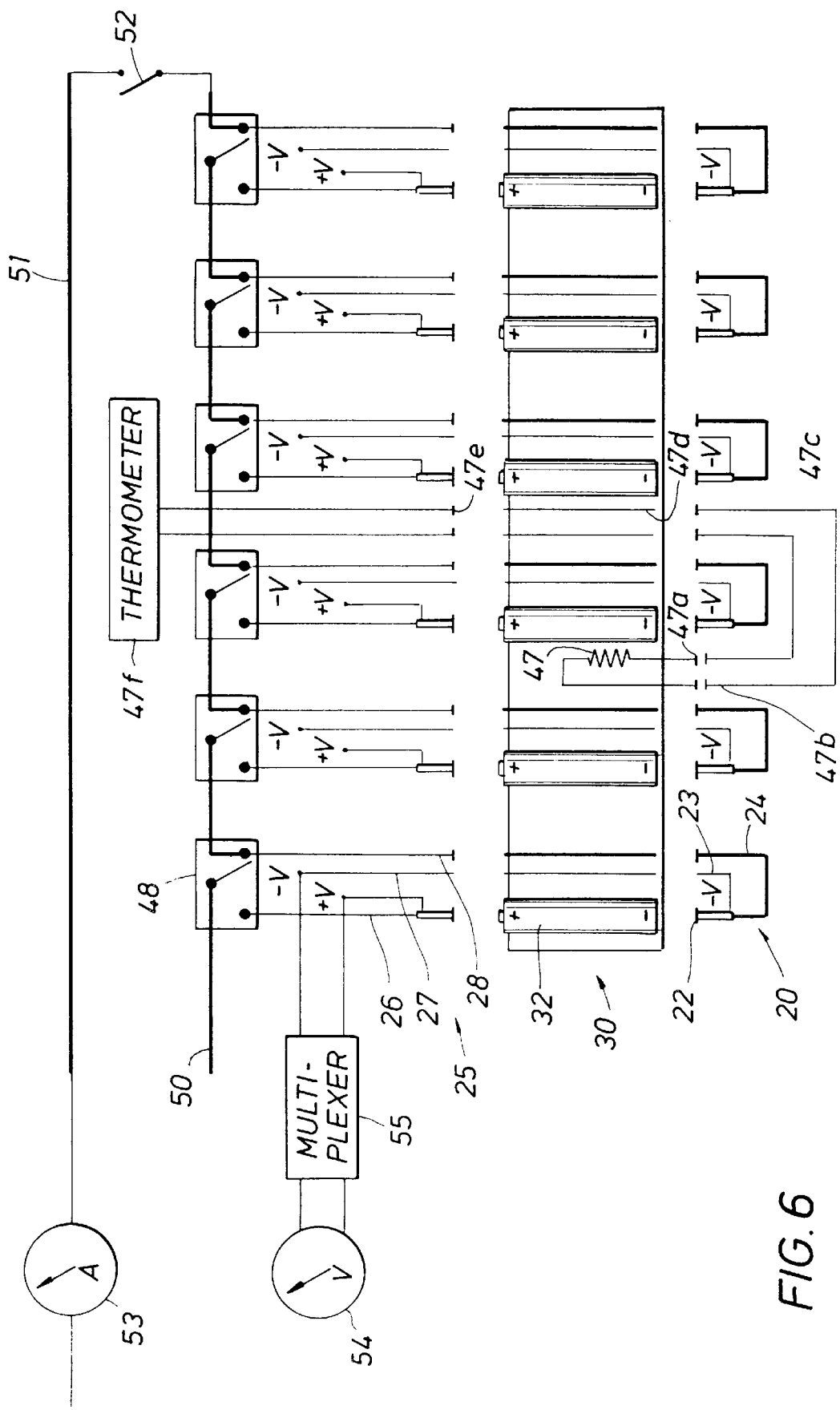
FIG. 6 shows current flow paths for testing many batteries and illustrates current flow paths involving the battery terminals, probe contacts, battery tray and parts adjacent to the batteries to form a rigid electrical path.

Attention is now directed to FIG. 6 of the drawings. This view shows a connection of several batteries in the tray 30 and the circuitry which is involved with the several batteries. As shown in FIG. 6, the battery tray 30 supports several identical batteries 32. As will be understood, the precise number can be increased substantially without limit. More specifically, it shows the lower contact assembly 20 which includes the centerline contact probe 22. Recall that this has two electrodes in it. One is the smaller electrode which provides a voltage point while the other is the larger surrounding external contact or electrode which provides a current flow path. As depicted in FIG. 6, they connect with conductors extending to the side under each battery. As specifically implemented, these lateral conductors are not wires but they are leads placed on the PCV as previously described. They cooperate with the marginal or edge located contact assemblies 23 and 24. In turn, they connect with vertically aligned posts on the tray 30 which are used to provide tray rigidity and which also provide the important auxiliary function of providing the needed current flow paths and signal paths. The upper contact assembly 25 is also shown. In it, the centerline contact assembly 26 which is structurally the same as the contact assembly 22 is positioned above the center electrode on the battery 32. Again, the marginal edge located contact assemblies 27 and 28 are also illustrated. While FIG. 6 is shown with conductors they are nevertheless deployed on a PCB as discussed. The several conductors connect then with a relay 48 which is located above the battery 32. While the tray 30 will hold N of the AAB, there are N relays 48 located in immediate proximity to the N batteries. The wiring shown above the batteries in FIG. 6 is accomplished by means of paths along the PCB. FIG. 6 shows current flow lines 50 and 51 which are connected together by a switch 52. The switch 52 can readily be an SCR or relay or hand switch. It is preferably accomplished with electronic control. For the tray 30, there is an ammeter 53 and a companion volt meter 54 is connected to one of the batteries through a multiplexer 55. The multiplexer 55 enables the volt meter to be selectively connected at different locations.

The relays 48 are provided with a control signal for each relay. They can be switched so that the current flow line 50 is connected within to deploy the several batteries in series or in parallel. Alternately, the relays can be operated to provide a dead short across the terminals of the battery 32. In the later instance, it is desirable to direct the current flow through the ammeter 53 in which instance the ammeter 53 is connected between the conductors 50 and 51. The relay 48 thus determines the test that is actually applied to the individual battery. A positive charging current can be provided to the battery, or a negative charging current can likewise be provided. A short can be deployed across the battery. The charging currents can be directed to the batteries either in parallel or in series. Numerous test routines can be implemented through the use of the relay 48 which is assigned to the particular battery located just below it, referring to the physical location of the relay as shown in FIG. 3A.

FIG. 6 has been enhanced at one location to show an optional added feature. A resistor has been shown adjacent to one of the batteries. The resistor is preferably a thermistor which operates as a heat sensor. It measures the heat build up in the battery. It is preferably located on the tray 30, but location at that point requires the implementation of the spring loaded compressible contact assemblies that are used for the voltage signal transfer from the battery tray 30 to the lower contact assembly 20 and then to the upper contact assembly 25. It is preferable that the signal be taken out through this route because it is easier to install signal paths on the PCB located above the upper contact assembly 25. Recall that the lower contact assembly 20 has to levitate when actuated. The upper contact assembly is not required to move and therefore the signal flow path includes the illustrated contact assembly which communicates in the same path as discussed with regard to FIGS. 3A and 3B. The thermistor 47 is thus provided with battery tray located PCB contact pads 47a which enable the compressible contacts 47b in the lower probe assembly to make contact and obtain the signals. In turn, those signals are conducted to edge located pads 47c on the lower probe assembly. In turn, they connect with the upstanding posts and associated pads. These are indicated at 47d. In turn, those connect with the contact assemblies 47e in the top contact assembly 25. The signal flow path (having the form of two PCB conductive paths) is directed out to a calibrated electronic thermometer 47f.

TEST PROCEDURE INVOLVING BATTERY CHARGING

One aspect of the present battery test system is the use of the battery tester to carry out charging tests. While this is not pertinent to many types of batteries, it is very important to rechargeable batteries and especially those which are often described as lithium batteries. This relates to testing so that the battery can be proved to accept recharging in the proper time interval. Moreover, this involves charging with a large number of batteries so that all can be tested in a batch. Again, the battery test apparatus, which is shown in mechanical detail in FIG. 1 and other aspects of the present disclosure, is ideally used. As will be understood, the relays which operate the individual batteries have to be switched so that several of the batteries are connected in series. That will be made more clear in a description of the test procedure set forth below. The mechanical support for the batteries undergoing this test is, therefore, implemented in the manner set forth in the other drawings of the present disclosure.

A typical lithium battery is charged and recharged many times during the life of the battery. The ability of the lithium battery to hold a particular charge is important. In this aspect, the ability of the battery to receive the charge, which is administered in the proper fashion, becomes important. Individual testing of an individual lithium battery is quite tedious. Each battery must be charged at a controlled rate of current over a time interval. After the charging current has been applied, the cell voltage is measured while the charging current is supplied to it so that the charging current times out, i.e., the requisite charging current can be stepwise decreased while charging to the maximum desired in a specified time window. Restated, the test involves applying a charge to the battery from an adjustable voltage, adjustable current source. After a specified interval, the total charge stored in the battery should be a specified value which is indicated by a decline in charging current measured in conjunction with the desired terminal voltage. This can be explained graphically as will be set forth in detail on reference to charging curves for an individual battery.

When many batteries must be charged, and then tested, the test could become quite tedious. While the test for a single battery might take many minutes or even hours, thereby tying up expensive test equipment, the test procedure is applied to a multitude of similar batteries so that they can be charged in series, tested and the data reported for all of the several batteries. This enables more efficient use of the capital equipment involved in charging and testing. For sake of nomenclature, an individual chargeable battery will be labeled B1. That refers to an individual chargeable cell such as a lithium battery. Several are made in a production facility so that several are connected in series, the series involving the batteries B1, B2, B3 and, BN where N is a whole number positive integer.

Figure 8:
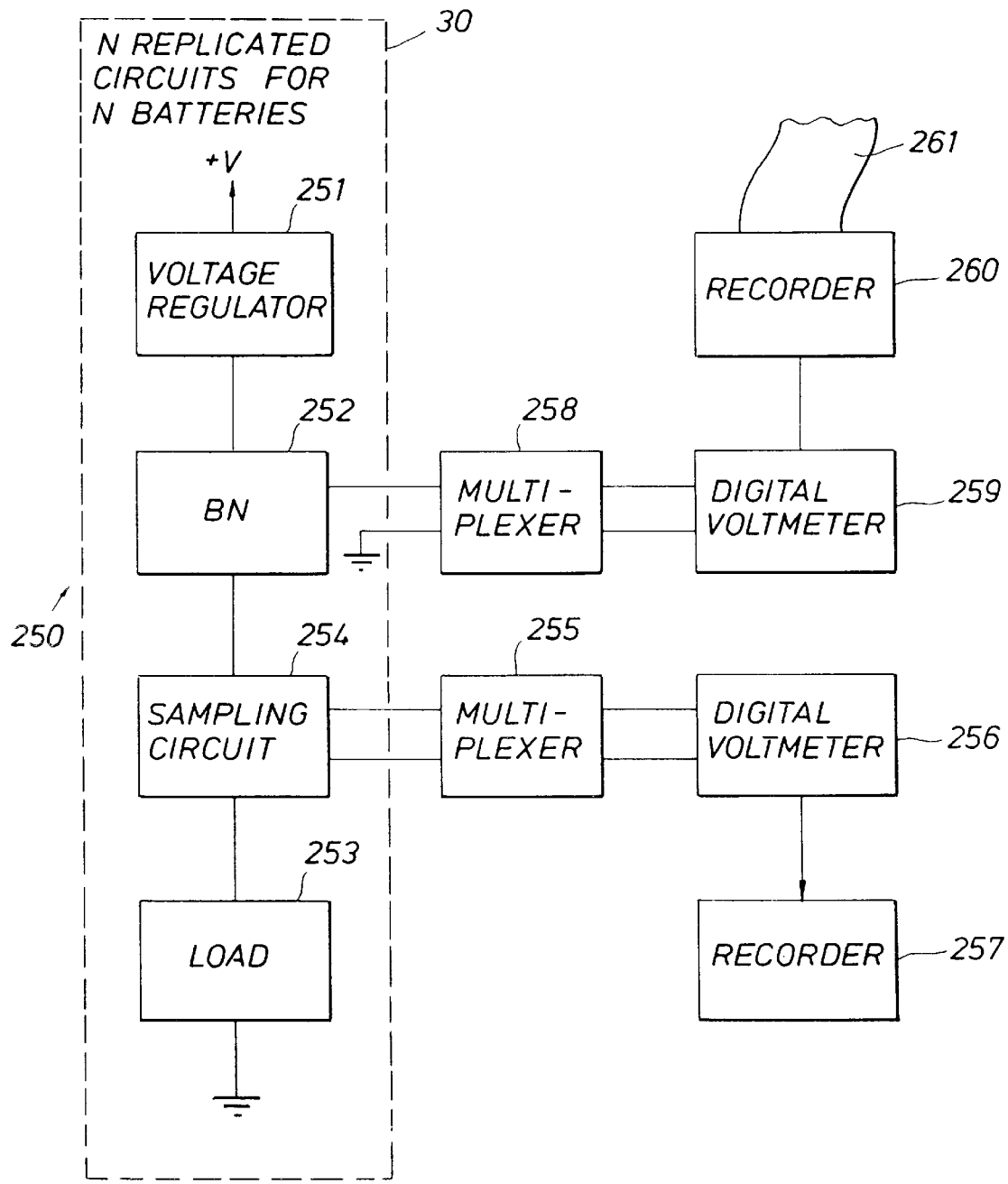
FIG. 8 shows one test schematic for testing several batteries using a multiplexed measuring system.

Attention is now directed to FIG. 8. FIG. 8 is a circuit which will be first described and examples of operation will be given. Beginning with FIG. 8, several batteries are in a tray 30 connected in parallel or series and are indicated by the symbols B1, B2 and BN. They are connected and charged in series or parallel dependent on test needs. The system shown in FIG. 8 is generally identified by the numeral 250. It includes an adjustable voltage and current power supply 251. This is connected at a selected terminal to form an output current which is applied to the first battery B1 and perhaps all of the BN. The output of the power supply 251 is measured by a volt meter 259 connected to the power supply. The volt meter 259 forms a measurement of the output or terminal voltage and that measurement is delivered to a time based recorder 260. A chart 261 is formed by the recorder. Typically, it will record the voltage and current values which are input to it. Several different voltages may also be optionally recorded. More will be noted concerning this hereinafter. The power supply 251 forms an output current which is delivered through a relay operated sampling switch 254. The switch 254 has complete circuit control, one being shown in the illustrated position where it is connected to charge the cell B1 (see FIG. 6). When appropriately switched, charging current is delivered to the battery B1 and the cell B1 is charged by the current from the PS 251. The cell B1 is connected with the volt meter 259 connected across it. The output of the volt meter 259 is provided to the recorder 260 for recordation. As will be understood, if the PS 251 is charging only a single battery, it is discouraged because it is not efficient use of the equipment. The equipment is used more efficiently and with greater benefit by charging a number of appropriately connected battery cells. Hence, FIG. 8 includes several connected cells up to BN.

The digital voltmeter (DVM 259) measures the terminal voltage across B1 or other batteries.

Confronting any ground loop problems which may exist, using tray 30, high speed DVM operation performs fast and accurate measurements on a large number of batteries undergoing tests. Assume, as an example, the battery tray 30 shown supports 100 batteries and each battery requires testing. Assume that the battery transport system set forth generally in FIGS. 1–7 is implemented so that the batteries are brought into the testing position where contacts are made with them. Assume also that the 100 batteries are to be tested with a common test protocol which involves a designated charging or discharging cycle. This test might impose a load on each battery where current is flowed from the battery for a short interval, perhaps a fraction of a second. Based on these assumptions, the equipment for testing 100 batteries would be very expensive in view of the ground loop problems just mentioned. Moreover, the capital equipment requirements are quite expensive if multiplexing is not permitted. Heretofore, multiplexing has been substantially forbidden in the sense that great care must be taken to provide the right ground point at the right location. Otherwise, to test 100 batteries in the example given, the system would require 100 current measuring devices and 100 digital volt meters where all had carefully selected ground connections so that stability of the ground connection could be relied on.

The present disclosure sets forth in FIG. 8 a system by which testing of 100 batteries can be easily accomplished. Within the tray 30 which is represented in dotted line in FIG. 8, there are 100 replicated sets of battery contact equipment. Each particular battery of the 100 in this example is provided with its own set of contact equipment. Assuming that the battery has an electrochemical voltage of 1.5000, and assuming further that it is provided with a sample load 253 (a resistor having a value of 0.1000 ohms), when that load is placed across the battery, the current should be 15.000 amps. In the example given, the battery circuit 250 (that circuit physically situated in the tray 30 and connected with the battery) includes the PS 251 flowing current to a designated battery 252 to be tested. That current is directed through a selected load resistor 253. There is a current sampling circuit 254 also included. In accordance with the present disclosure and taking into account the problems with ground loops and false readings which derive from these there is a current flowing through the system including the sampling circuit 254. The resistor 253 defines the current flow in an abstract sense. That current, however, has to be measured or sampled. Moreover, the current may have a transient start and then a steady state aspect. Indeed if it flows for any interval of time, it will also have a decay curve as the battery heats and the resistance changes as a result of internal resistance in the battery. All these factors must be appropriately noted and there must be, therefore, a timing cycle for taking the sample. At a given instant, the circuit 250 is closed and made operative so that current flows through the load 253. At a related time interval thereafter, the multiplexer 255 is operated to obtain a signal from the circuit 250. The multiplexer has a "settle" time requirement also. Fortunately, that can be in microseconds so that the multiplexer can be assumed to operate instantaneously. In turn that provides an output signal to a digital volt meter 256. The digital volt meter also has a settle time. By timing all these events in the appropriate fashion, a valid measure from the digital volt meter is provided to the recorder 257. Thus, the battery current is measured. The sample measurement is transferred at the appropriate time and represents the current flow. This is accomplished by using this timed arrangement so that the DVM output to the recorder is a signal representative of current flow at the measured instant.

FIG. 8 shows a different system for measurement of voltage. Recall that the voltage measurement may well risk a ground loop problem. To this end, the ground loop must be avoided. For that reason, FIG. 8 additionally times the voltage measurement through the multiplexer 258 and the DVM 259.

Going now to an overview of what is accomplished with the system shown in FIG. 8, if the tray 30 holds 100 batteries, multiplexers 255 and 258 are readily available which operate at sufficient speeds so that they can obtain samples with a settle time sufficiently fast utilizing the digital volt meters 256 and 259 that data is obtained for all 100 of the batteries. One benefit of this is to reduce the number of expensive electronic measuring devices required. Consider, as an example, that the tray 30 is operated so that all contacts are brought into contact against the 100 batteries. Assume further that the batteries are all tested at the same approximate beginning point in time. Signals are formed indicative of the current curve as a function of time and they are sampled for all 100 and the outputs are provided to the recorder 257. Avoiding ground loop problems, and using an assigned sampling resistor for each battery, suitable current related curves are provided for multiplexing and the necessary data can be obtained. with only one DVM. This enables a tremendous reduction in cost. Also, the same aspect will be noted in regard to the voltage measurements. Moreover, and very importantly, current and voltage measurements both are made in a fashion to avoid ground loop problems that otherwise arise in this kind of system. Typically, ground loop problems will arise when attempting to test 100 batteries utilizing a heavy duty current ground.

While the foregoing is directed to the preferred embodiment, the scope is determined by the following claims.

We claim:

1. An apparatus for testing a battery having spaced positive and negative terminals thereon, the apparatus comprising:

(a) a battery tray for holding the battery in a fixed position so that the positive and negative terminals thereof are exposed;

(b) contacts for contacting the battery including a positive terminal contact and a negative terminal contact;

(c) test signal apparatus responsive to said contacting and for testing of the battery;

(d) a clamp mechanism comprising a cam mechanism to initiate and then terminate engagement and disengagement of said contacts with the terminals of the battery; and (e) a current flow path including said test apparatus, positive and negative contacts, and said battery wherein said current flow path is implemented by operation of said cam mechanism.

2. The apparatus of claim 1 wherein said battery tray is constructed and arranged to hold N batteries where said N batteries are all positioned with the positive and negative terminals thereof exposed for contact in like fashion, and said battery tray is removable from said clamp mechanism so that said battery tray can be loaded with N batteries and thereafter unloaded after testing and testing is conducted through said clamp mechanism.

3. The apparatus of claim 2 wherein said battery tray comprises spaced planar members with a space there between so that N batteries are held in a common orientation and are parallel thereby exposing the positive terminals in a common orientation, and also exposing the negative terminals in a common orientation, and said tray inserts into and from engagement with said clamp mechanism to form battery test circuit connections through said clamping mechanism with no wiring.

4. The apparatus of claim 3 wherein said battery tray also includes N individual current flow structural members there through for the N batteries in said battery tray to avoid wiring in the battery test circuits.

5. The apparatus of claim 4 wherein said battery tray incorporates an individual control switch for each of said N batteries and said switches are selectively operable to control connection of said N batteries into said current flow path for testing by said test apparatus and said test circuit connections are through said battery test circuits to avoid wiring.

6. The apparatus of claim 5 wherein said N switches comprise N relays, and one relay is uniquely connected to each battery of said N batteries, and said relays and batteries are controllably switched so that the batteries for testing are selectively connected in series and selectively connected in parallel by said tray and said clamp assembly to avoid wiring and circuit connections are solely through said clamp mechanism.

7. The apparatus of claim 1 wherein said positive and negative terminal contacts are aligned to move toward a battery for testing and are relatively movable away from a battery after testing.

8. The apparatus of claim 1 wherein said terminal contacts include a current terminal contact and a separate voltage terminal contact.

9. The apparatus of claim 8 wherein said separate current and voltage contacts are arranged concentrically on a common axis.

10. The apparatus of claim 7 wherein said contacts are spring biased.

11. The apparatus of claim 1 wherein said cam mechanism comprises a rotatable shaft supporting a cam thereon and said cam is positioned to move said battery tray in a direction for contacting, said contacts against the terminals of batteries in said battery tray.

12. The apparatus of claim 11 wherein said cam and cam shaft are rotatable between first and second positions wherein said first position permits said tray to be inserted and removed to an operative position with respect to said cam shaft, and wherein said second position moves said tray supporting said batteries into said contacts.

13. The apparatus of claim 12 wherein said tray mounts in a spaced relationship separated from said contacts, and said tray is retracted from the mounted position for loading or unloading batteries therein.

14. The apparatus of claim 11 wherein said cam mechanism comprises said rotatable cam and shaft below said tray; and said tray is an elongate rectangular frame sliding to a position between said positive and negative terminal contacts so that test circuits for said batteries are connected in N current flow paths with no wiring.

15. The apparatus of claim 14 wherein replicated positive terminal contacts are spaced from replicated negative terminal contacts, there being N each positive and negative terminal contacts for testing N batteries.

16. The apparatus of claim 15 wherein said positive terminal contacts define a plane and said negative terminal contacts define a spaced and parallel plane and said two planes are spaced apart to receive said tray therebetween to form N current flow paths having structurally rigid conductors.

17. The apparatus of claim 15 wherein said tray holds N batteries and supports said batteries aligned so that said batteries are aligned for simultaneous movement into operative connection to said contacts.

18. The apparatus of claim 17 wherein said batteries each are held with parallel axes and said axes are coincident with said contacts.

19. The apparatus of claim 17 including dedicated and isolated, structurally rigid current flow members supported by said tray to complete isolated current flow paths through said tray for each of said batteries.

20. A battery testing apparatus comprising:
   (a) a battery tray for holding an upstanding battery;
   (b) a battery tray receptacle for holding said battery tray;
   (c) first and second battery terminal contacts located in said battery receptacle so that said battery tray, after positioning within said battery tray receptacle, positions the upstanding battery in aligned relationship with the terminal contacts;
   (d) a tray transport for moving said battery tray in said receptacle so that said battery tray moves the upstanding battery to the terminal contacts and thereby connects said upstanding battery in current conducting communication with a battery test circuit; and
   (e) said tray transport moves the upstanding battery to end current conducting communication with the battery test circuit.

21. The apparatus of claim 20 wherein said battery tray is constructed and arranged to hold N batteries where said N batteries are all positioned with the positive and negative terminals thereof exposed for contact in like fashion, and said battery tray is removable so that said battery tray can be loaded with N batteries and can be unloaded of N batteries after testing.

22. The apparatus of claim 21 wherein said battery tray comprises spaced structurally rigid members with a space there between so that batteries are held in a common orientation and are parallel thereby exposing the positive terminals in a common orientation, and also exposing the negative terminals in a common orientation.

23. The apparatus of claim 22 wherein said battery tray also includes N individual current flow structural members there through for the N batteries in said battery tray.

24. The apparatus of claim 23 wherein said battery tray incorporates an individual control switch for each of said N batteries and said switches are selectively operable to control connection of said N batteries into said current flow path for testing by said battery test circuit comprising a current measuring apparatus.

25. The apparatus of claim 24 wherein said switches comprise N relays, and one relay is uniquely connected to each battery, and said relays and batteries are controllably switched so that the batteries are selectively connected in series and selectively connected in parallel.

26. The apparatus of claim 20 wherein said positive and negative terminal contacts are aligned to move toward a battery for testing and are relatively movable away from a battery after testing.

27. The apparatus of claim 26 wherein said terminal contacts include a current terminal contact and a separate voltage terminal contact.

28. The apparatus of claim 27 wherein said separate current and voltage contacts are arranged concentrically on a common axis.

29. The apparatus of claim 28 wherein said contacts are spring biased.

30. The apparatus of claim 20 wherein said tray transport comprises a cam mechanism having a rotatable shaft supporting a cam thereon and said cam is positioned to move said battery tray in a direction for contacting said battery terminal contacts against the terminals of batteries in said battery tray.

31. The apparatus of claim 30 wherein said cam and cam shaft are rotatable between first and second positions wherein said first position permits said battery tray to be inserted and removed to an operative position with respect to said cam shaft, and wherein said second position moves said tray supporting said batteries into said battery terminal contacts.

32. The apparatus of claim 31 wherein said tray mounts in a spaced relationship separated from said battery terminal contacts, and said tray is retracted from the operative position for loading or unloading batteries therein.

33. The apparatus of claim 30 wherein said tray transport comprises said rotatable cam and shaft below said battery tray; and said battery tray is an elongate rectangular frame sliding to said battery tray receptacle in a position between said positive and negative terminal contacts.

34. The apparatus of claim 33 wherein replicated positive terminal contacts are spaced from replicated negative terminal contacts, there being N each positive and negative terminal contacts for testing N batteries.

35. The apparatus of claim 34 wherein said positive terminal contacts define a plane and said negative terminal contacts define a spaced and parallel plane and said two planes are spaced apart to receive said battery tray there between.

36. The apparatus of claim 35 wherein said battery tray holds N batteries and supports said batteries aligned so that said batteries are aligned for simultaneous movement into operative connection to said terminal contacts.

37. The apparatus of claim 36 wherein said N batteries each are held with parallel axes and said axes are coincident with said terminal contacts.

38. The apparatus of claim 36 including dedicated and isolated, structurally rigid current flow members supported by said battery tray to complete isolated current flow paths through said battery tray for each of said N batteries.

39. The apparatus of claim 38 including a separate load resistor for each battery.

40. A method of measuring battery performance comprising the steps of:
   (a) connecting a power supply to a battery for testing said battery's capacity to receive and hold a charge, wherein
      (i) said power supply is connected with a probe comprising a first spring loaded contact and a second spring loaded contact, and
      (ii) said first and said second contacts move independently;
   (b) forming for the battery a test current having a:
      (a) selected amplitude;
      (2) selected duration; and
      (3) selected polarity;
   (c) directing the test current through a current measuring circuit;
   (d) operating the current measuring circuit to form a time dependent measurement of current flow through the battery to determine said battery's capacity to receive and to hold a charge;
   (e) disconnecting the battery after testing and then connecting a second battery for testing and repeating steps (b), (c) and (d).

41. A battery testing apparatus comprising:
   (a) a battery supporting tray for holding plural batteries to be tested;
   (b) a contact assembly into which said tray is fitted and to enable electrical contact with batteries supported by said tray;
   (c) a battery test circuit within said contact assembly wherein said circuit connects to a battery and current flows from said battery through said circuit for testing operating specifications of said battery;

(d) a set of battery specific contacts in said contact assembly for connecting to said battery and positioned to electrically engage and thereafter disengage a battery in said tray to enable current flow in said battery test circuit;

(e) wherein said battery specific contacts comprise first and second motion actuated contacts moving into and out of contact with said battery so that said battery test circuit is enabled.

42. The apparatus of claim 41 wherein said battery supporting tray comprises at least first and second spaced planar members separated by a specified distance so that plural batteries are held thereby, and further including battery tray supported current conductors which comprise a portion of said battery test circuit.

43. The apparatus of claim 41 wherein said contact assembly comprises spaced upper and lower contacts for contact with a battery being tested and thereby supported in said battery supporting tray, and said upper and lower contacts are connected to define said battery testing circuit and said battery testing circuit comprises rigid current conductors defining a current flow path between said upper and lower contacts.

44. The apparatus of claim 41 wherein said set of battery specific contacts comprises at least a pair of concentric contacts wherein one is deployed centrally of the other and both move independently so that they can extend for contact with a battery terminal, and one of the two contacts provides a separate voltage signal path and the other of said two contacts provides a separate flow path.

45. A battery test system comprising:
(a) first and second battery test probes having concentric, sliding and independently spring loaded contacts deployed for mating contact against a battery to test the battery for battery performance;
(b) a battery test circuit connecting through said first and second battery test probes to a battery for testing;
(c) a structurally rigid component cooperating with said first and second battery test probes to position said first and second battery test probe for releasable contact against said battery for testing; and
(d) a battery test component comprising a battery measuring device and connected by said test circuit to the battery for testing the battery and forming an indication of battery performance.

46. The battery test system of claim 45 further comprising:
(a) a test battery mount; and
(b) a structurally fixed and supported current conductor electrically communicated with one of said battery test probes and extending to the other of said battery test probes to define a completed circuit to enable charging or discharging current through the battery being tested on said battery mount.

47. The battery test system of claim 46 further comprising:
(a) a PCB with a conductor thereon;
(b) a conductive structurally rigid post connected to a conductor on said PCB;
(c) a second PCB spaced from said first PCB and having a conductor thereon and connected to said post; and
(d) wherein said first and second battery test probes are respectively mounted on said first and second PCBs.

48. A battery test system comprising:
(a) first and second battery test probes having contacts deployed for mating contact against a battery to test the battery for battery performance;
(b) a battery test circuit connecting through said first and second battery test probes to a battery for testing;
(c) a structurally rigid test component cooperating with said first and said second battery test probes to position said first and second battery test probe for releasable contact against said battery for testing; and
(d) wherein said battery test circuit is comprised solely of structurally rigid conductors connected to said first and second test probes and a measuring instrument.

49. The battery test system of claim 48 wherein said probes are relatively variable in spacing to bias said probe contacts at a spacing to enable movement into a clamping position in contact with a pair of battery terminals for testing said battery for battery performance.

50. The battery test system of claim 49 wherein said probes include at least one moveable contact.

51. The battery test system of claim 48 wherein said first and second battery test probes are:
(a) concentrically deployed around a common axis;
(b) independently axially movable;
(c) resiliently mounted;
(d) sized to conduct different current levels.

52. The battery test system of claim 51 wherein said first and second test probes are contacted against a common battery terminal and each of said probes connects to a separate structurally rigid test circuit component; and said test circuit measures current and voltage separately through said first and second probes.

53. A battery test probe assembly comprising:
(a) a base socket mounted on a PCB;
(b) a first socket leg extending from one end of said base socket;
(c) a second socket leg at the same end of said base socket and
(i) electrically insulated from said first socket leg, and
(ii) axially positioned within said first socket leg;
(d) wherein said socket legs are constructed and arranged to
(i) electrically extend through said PCB,
(ii) each connects to a PCB conductive pad on said PCB, and
(iii) each forms a signal path from said socket legs to each said conductive pad on said PCB; and
(e) a probe assembly positioned positioned concentrically within said socket and contacting said first and said second socket legs to provide electrical connection to said socket legs to form signal paths to said conductive pads on said PCB, wherein
(i) said probe comprises two concentric members, and
(ii) each said concentric member is independently spring loaded.

54. The probe assembly of claim 53 wherein said concentric members of said probe assembly further comprise first and second separate electrical connections through said first and second socket legs to first and second conductive pads on said PCB and said first and second conductive pads define separate, electrically independent connections.

55. The probe assembly of claim 54 wherein said base socket has an elongate, upstanding, sleeve constructed to removably receive said probe assembly.

56. The probe assembly of claim 55 wherein said base socket has a circular lower end having said first leg thereon, and attached stakes to enable said stakes to extend through a matching set of holes in said PCB, and said stakes are conductive metal to enable electrical connection.

57. The apparatus of claim 53 wherein said first socket leg is an elongate current carrying metal member connected to said first conductive pad; and said second socket leg is centered within said first socket leg and extends below said socket and connects to a second and separate conductive pad.

58. The apparatus of claim 53 wherein said probe assembly includes:

(a) a movable conductive tip;

(b) an elongate shaft for said tip;

(c) a spring moving said tip to extended position; and (d) wherein said tip and shaft form an electrically conductive signal pathway for a voltage measurement.

59. The apparatus of claim 53 wherein said probe assembly inserts into and electrically connects through said base socket to each said leg to there by define a test signal pathway.

60. The apparatus of claim 59 including a bias spring pushing said probe assembly to an extended signal measuring position.

61. The apparatus of claim 60 wherein said bias spring acts against a movable signal measuring tip.

62. The apparatus of claim 53 wherein:

(a) said first leg includes at least two parallel legs connected to said base socket and extending through said PCB to a common conductive pad;

(b) said second leg is formed in a hole through said PCB centered with respect to said base socket and extends through said PCB to a separate conductive pad; and (c) said first and second legs differ in size to provide different current conductive paths.

* * * * *